United States Patent [19]

Leonov et al.

[11] Patent Number: 5,507,614

[45] Date of Patent: Apr. 16, 1996

[54] HOLDER MECHANISM FOR SIMULTANEOUSLY TILTING AND ROTATING A WAFER CASSETTE

[75] Inventors: Mark Leonov, Santa Clara; Emile N. Kerba, Los Altos; Jack Aknin, San Carlos, all of Calif.

[73] Assignee: Cybeq Systems, Menlo Park, Calif.

[21] Appl. No.: 397,561

[22] Filed: Mar. 2, 1995

[51] Int. Cl.$^6$ ..................................................... B25J 11/00
[52] U.S. Cl. ..................... 414/768; 414/776; 414/778; 414/936; 414/937; 414/940
[58] Field of Search ..................................... 414/768, 772, 414/776, 778, 786, 936, 937, 940, 742, 743, 744.4

[56] References Cited

U.S. PATENT DOCUMENTS

| | | | |
|---|---|---|---|
| 3,700,132 | 10/1972 | Waters | 414/743 |
| 3,795,323 | 3/1974 | Ouska | 414/778 |
| 4,322,198 | 3/1982 | Zuber | 414/776 |
| 4,778,332 | 10/1988 | Byers et al. | 414/936 |
| 4,892,455 | 1/1990 | Hine | 414/936 |
| 4,923,054 | 5/1990 | Ohtani et al. | 414/937 |
| 5,180,273 | 1/1993 | Sakaya et al. | 414/940 |
| 5,409,348 | 4/1995 | Suzuki | 414/937 |

*Primary Examiner*—David A. Bucci
*Assistant Examiner*—Douglas A. Hess
*Attorney, Agent, or Firm*—Flehr, Hohbach, Test, Albritton & Herbert

[57] ABSTRACT

A holder mechanism tilts and rotates a vertically oriented wafer-loaded cassette for proper presentation in a horizontal orientation to the robotic arm of a workstation. The mechanism includes a cassette holder, a support member, and a motor. The cassette holder has first and second supports that define orthogonal first and second planes. In two embodiments, the support member connects the cassette holder to the motor shaft and, as the motor shaft rotates, the cassette holder is rotated about a single pivot axis that is oblique to the first and second planes. This rotation tilts a cassette placed in the holder through a tilt angle of about 45° to 90°, and simultaneously rotates the cassette through an angle θ about the vertical axis. The support member shape determines whether tilting and rotation is away from or toward the motor, and also determines the angle of rotation θ and the tilt angle. After workstation processing, the motor rotates in the opposite direction to produce a counter-tilt and counter-rotation that returns the cassette to a vertical orientation. In a third embodiment, the support member is coupled to a horizontal shaft that is coupled to a worm gear assembly. Vertical motor shaft rotation rotates the horizontal shaft through a tilt angle, and simultaneously rotates the cassette holder through the rotation angle θ.

12 Claims, 6 Drawing Sheets

HOLDER MECHANISM FOR SIMULTANEOUSLY TILTING AND ROTATING A WAFER CASSETTE

FIELD OF THE INVENTION

The present invention relates generally to handling semiconductor wafers during fabrication, and more specifically to an automated mechanism for tilting and rotating a wafer cassette when it is holding semiconductor wafers.

BACKGROUND OF THE INVENTION

Integrated circuits ("IC's") and discrete semiconductor devices such as transistors are fabricated on substrate wafers. Using techniques well known in the art, raw silicon is refined and grown into a single-crystal cylinder (known in the art as a "boule") whose diameter may range from about 4" to 12" or more. The cylinder is then sliced into a plurality of single-crystal wafers that are lapped, chemically etched and polished to form finished wafers.

The finished wafers serve as the starting substrate upon which various semiconductor devices and integrated circuits may be formed. During their fabrication and subsequent handling, the wafers are loaded into a cassette that typically can hold up to 25 wafers. FIGS. 1A and 1B depict a cassette 2 respectively in vertical and horizontal orientations loaded with wafers 4.

As used herein when the wafers are vertically oriented as shown in FIG. 1A, the cassette is said to be vertically oriented, and when the wafers are horizontally oriented as shown in FIG. 1B, the cassette is said to be horizontally oriented. An "arrow marker" 6 is shown in FIG. 1B to ease following the change in orientation and rotation of the cassette. It will be recognized, though, that actual cassettes probably will not include such an arrow marker.

Cassette 2 in FIGS. 1A and 1B is a representation of an actual cassette, although most cassettes can hold up to 25 finished wafers. For ease of illustration, cassette 2 is depicted as having the capacity to hold 9 rather than 25 wafers. Only six finished wafers are shown to illustrate that it is not necessary that all of the wafer positions be used.

Formation of semiconductor devices and ICs upon the finished wafers occurs at a semiconductor fabrication facility, referred to in the art as a "fab". A modern fab can include 150 work stations, at which the wafers undergo specific processes, e.g., introduction of dopant materials, formation of oxides, etching, wafer sorting, and so forth. FIG. 2 depicts a generic fab 8 as including a number of workstations WS1, WS2, WS3. Associated with each workstation is at least one robotic arm mechanism 12, often referred to as an "end effector" or "extractor". In general, mechanism 12 unloads wafers from a cassette and reloads the wafers into the cassette after processing at the workstation.

Wafers to be treated are typically transported between workstations in a cassette. To protect the wafers against spillage, the wafer-loaded cassettes are moved between workstations in a vertical orientation as shown in FIG. 1A. This inter-workstation orientation is depicted in FIG. 2 by vertically-oriented cassettes 2-V, which hold wafers 4-V, the "V" notation indicating the vertical orientation of the cassette. In the present state of the art, the vertically oriented wafer-loaded cassettes typically are hand-carried between workstations by human operators.

The workstations have a generally horizontal work surface 10 upon which one or more wafer-loaded cassettes 4 are placed in a horizontal orientation, such as shown in FIG. 1B.

Robotic arm 12 then withdraws a horizontally oriented wafer, e.g., wafer 4-H, from a generally horizontally oriented cassette, e.g., cassette 2-H, the "H" notation indicating the horizontal orientation.

The robotic arm then moves the wafer into a working position at the workstation for processing. Workstation WS1, for example, is depicted as including mechanism denoted as WS1-P1 that performs a specific procedure upon each horizontally oriented wafer 4-H in a cassette 2-H. Workstation WS2 is shown as generically including two mechanisms, WS2-P1 and WS2-P2, that each perform a process upon the horizontally oriented wafers at that station.

Thus, at each workstation the cassette must be tilted from a vertical orientation required for safe wafer handling between workstations, to a generally horizontal orientation required by a workstation robotic arm. Generally, the required tilt angle will be about 90°. In addition, once horizontally oriented, it will usually be necessary to rotate the wafer-loaded cassette through some angle θ about the vertical Z-axis for proper presentation of the wafers to the robotic arm. The rotation angle θ will generally range from about 0° to 90°. Mechanical guides 14 that are attached to the horizontal workstation surface 10 can assist the operator in achieving the necessary degree of rotation about the vertical axis.

In a present-day fab, a small percentage (perhaps 10%) of the workstations may include a mechanism that receives the cassette in a vertical orientation and tilts the holder 90° into a horizontal orientation. However, the majority of workstations require that the human operator carrying the cassette, manually tilt the cassette approximately 90° (to achieve a horizontal orientation) and also rotate the cassette some angle θ about the vertical axis to achieve a proper orientation for the robotic arm to access the now horizontally oriented wafers.

Unfortunately, manually tilting and rotating a wafer-loaded cassette can be ergonometrically challenging. Fab procedures dictate not only minimum clean room standards, but also minimum ergonometric standards for the human operators who hand-carry cassettes. A cassette fully loaded with wafers can present a sufficiently heavy load that precludes tilting 90° and rotating through an angle θ, in a sound ergometric manner. For example, a cassette containing 25 12" diameter wafers can weigh perhaps 20 pounds (9 Kg). In the future, when even larger diameter cylinders can be grown, manually tilting and rotating a fully loaded cassette may not be ergonometrically feasible. In addition, at some workstations, the space in which the wafer-loaded cassette must be tilted and rotated may be quite limited. Such space limitations can further hamper operator maneuverability in tilting and rotating a loaded cassette.

In future fabs, it is likely that an automated conveyer belt will replace human operators in transporting the cassettes, in a vertical orientation, from workstation to workstation. However, upon arrival at the majority of the workstations, the wafer-loaded cassettes will still have to be tilted 90° into a horizontal orientation and then be rotated some angle θ about the vertical axis. Upon completion of processing at a given workstation, the cassette must then be tilted 90° from a horizontal to a vertical orientation, counter-rotated through an angle −θ about the vertical axis, and then returned to the conveyor belt.

In summary, there is a need for a mechanism that can tilt a wafer-loaded cassette approximately 90° from a generally vertical to generally horizontal orientation. Such mechanism should simultaneously rotate the cassette through a desired angle θ about the vertical axis for proper presentation of the wafers to the robotic arm of a workstation. After workstation processing is complete, the mechanism should receive the horizontally oriented cassette, and then provide a counter-tilt and counter-rotation of −θ about the vertical axis, and counter-tilt the holder approximately 90°, returning the cassette to a vertical orientation. Preferably such mechanism should not require excessive workstation space for implementation and operation.

The present invention discloses such a mechanism.

SUMMARY OF THE INVENTION

In one aspect, a mechanism for tilting and rotating a wafer-loaded cassette includes a cassette holder, a support member, and a motor. The cassette holder has first and second supports that define orthogonal first and second planes. The support member mechanically connects the cassette holder to the motor shaft. As the motor shaft rotates, the cassette holder is rotated about a single pivot axis that is oblique to the first and second planes.

Rotating the holder about the single pivot axis results in simultaneous tilting of a cassette placed in the holder through a tilt angle, and rotation of the cassette through an angle θ about the vertical axis. The shape of the support member determines the magnitude of the rotation angle and the tilt angle resulting from a given amount of motor shaft rotation. Further, the shape of the support member governs whether tilting and rotation movement is away from or toward the motor.

In a second aspect, a mechanism for tilting and rotating a wafer-loaded cassette advantageously may be constructed beneath the surface of a workstation. The mechanism includes a cassette holder providing first and second supports defining orthogonal first and second planes, a support member, and a motor. Vertical motor shaft rotation is converted through pulleys and belts, a bearing unit and a worm gear assembly into rotation of a horizontal axis connected to the support member through a tilt angle, and into simultaneous rotation of the cassette holder through a desired angle θ about the vertical axis.

With either aspect, semiconductor wafers placed in the cassette may be carried in a vertical orientation from workstation to workstation, and then placed in the cassette holder. The present invention then simultaneously tilts the cassette and wafers therein through a tilt angle ranging from about 45° to 90° from a vertical to a generally horizontal orientation, and also rotates the cassette through an angle θ ranging from about 0° to 90° for proper wafer presentation to a robotic arm associated with the workstation.

In a third aspect, a workstation is constructed to include at least two mechanisms for simultaneously tilting and rotating a wafer-loaded cassette.

Other features and advantages of the invention will appear from the following description in which the preferred embodiments have been set forth in detail, in conjunction with the accompanying drawings.

DETAILED DESCRIPTION OF THE PREFERRED EMBODIMENT

Figure 3A:
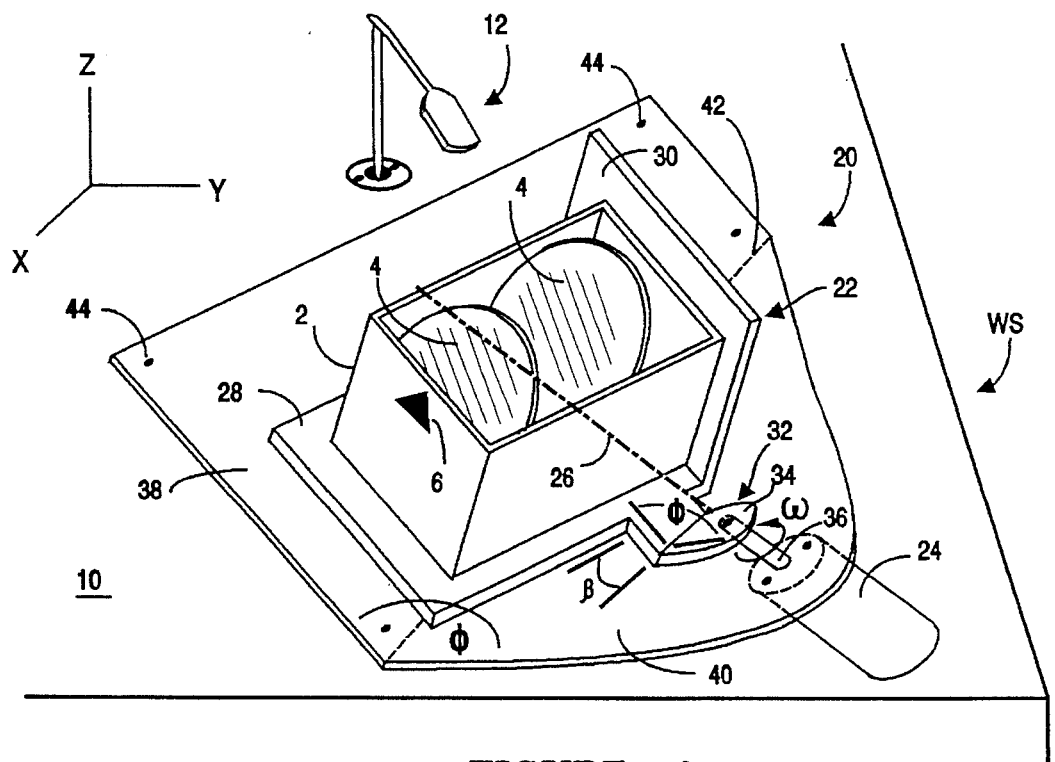
FIG. 3A depicts a first embodiment of a mechanism for tilting and rotating a cassette away from a drive motor, according to the present invention.
Figure 3B:
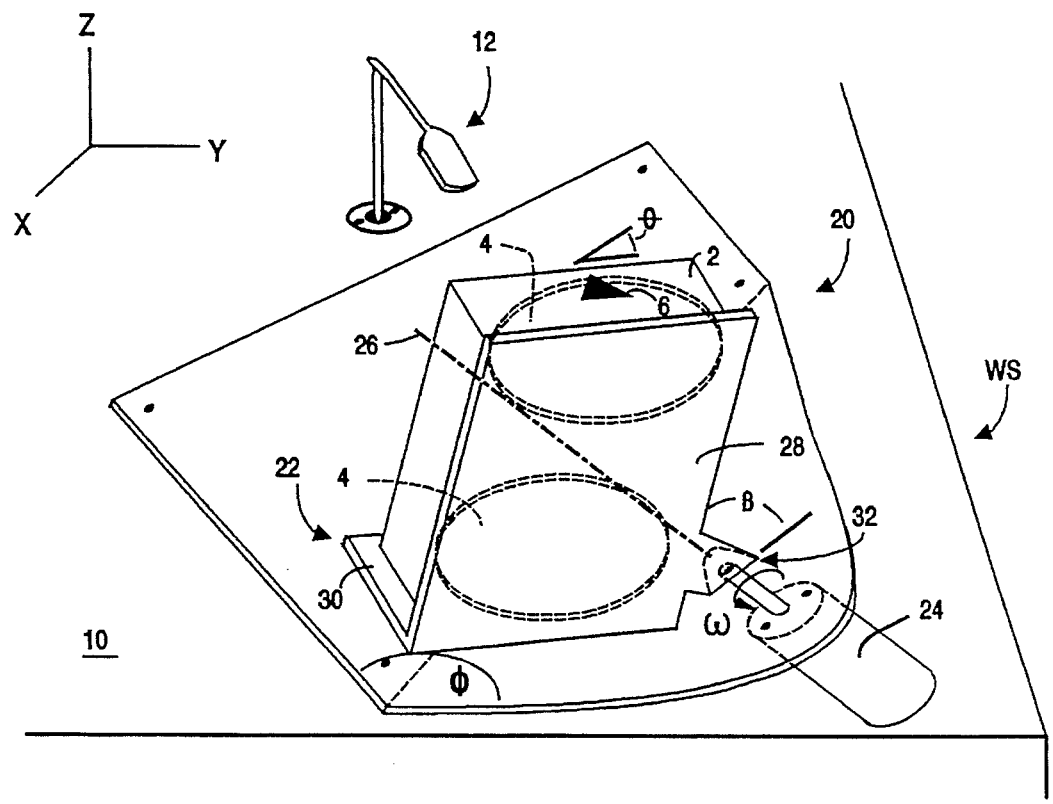
FIG. 3B depicts the embodiment of FIG. 3A after tilting and rotation, according to the present invention.

FIGS. 3A and 3B depict a first embodiment of the present invention. In FIG. 3A, a cassette 2 loaded with wafers 4 (only two of which are shown for ease of illustration) is shown placed in a vertical orientation on a tilt/rotation rotation mechanism 20 of the present invention. For ease of illustration, the slots that define the wafer holding positions in cassette 2 are not drawn. In the figures, the X-axis and Y-axis together define a horizontal plane, and the Z-axis denotes the vertical dimension.

Mechanism 20 includes a cassette holder 22 having a support member 32, and a motor 24 that rotates holder 22 about a single pivot axis represented by 26. In FIGS. 3A and 3B, mechanism 20 is shown on a planar and typically horizontal surface 10 of a workstation WS that includes a robotic arm, shown generically as 12. Robotic arm 12 can withdraw wafers 4 from cassette 2 if the wafers are in a generally horizontal orientation and if the cassette has been rotated through an angle θ about the Z-axis so that the wafer edges face the robotic arm. It is the purpose of mechanism 20 to provide such wafer tilting and rotation in a simultaneous fashion.

Cassette holder 22 includes a first support 28 and a second support 30 that define respective orthogonal first and second planes. In the embodiment of FIG. 3A, the first and second supports are planar, and the first and second planes are thus coincident with these planar support surfaces. In general, supports 28 and/or 30 need not be planar as shown in the figures. For example, supports 28 and/or 30 could comprise two or more fork-like tines against which cassette 2 may be supported. However, even if the supports are substantially planar, they may include indentations, mechanical stops or other features (not shown) that can assist rapid manual or mechanical placement of a cassette on holder 22.

The single pivot axis 26 is oblique to the first and second planes. By "oblique" it is meant that axis 26 is not parallel to either of the planes. In FIG. 3A, the pivot axis 26 traverses cassette 2 somewhat diagonally, going from approximately the lower right corner to approximately the upper rear corner.

In the embodiment of FIGS. 3A and 3B, cassette holder 22 includes a rigidly attached support member 32 that is inclined at an angle Φ relative to the first plane. The intersection of the inclined portion 34 of support member 32 and a longitudinal axis of the first plane defines an angle β. If desired, supports 28, 30 and support member 32 may be integrally formed, for example from a single piece of metal or from molded plastic. Motor 24 includes a rotatable shaft 36 that is fixedly attached to the distal portion of support member 32, and whose rotational axis defines pivot axis 26.

Proper selection of support member 32 angles Φ and β will cause rotation of holder 22 about pivot axis 26 through an angle ω, to produce a desired amount of simultaneous tilting and rotation. Generally, if Φ>90° holder 22 will be tilted and rotated away from the motor (as is the case for the embodiment of FIGS. 3A and 3B). Thus in FIG. 3B, after tilting and rotation have occurred, holder 22 faces generally to the left, whereas the motor 24 is disposed to the right. The amount of time required for the simultaneous tilting and rotation about axis 26 preferably is in the range of a few seconds to perhaps ten seconds, and depends upon the motor speed. Tilting and rotating the cassette holder too rapidly may cause the wafers to fall out or be otherwise damaged, and tilting and rotating too slowly will needlessly waste time.

The orientation of pivot axis 26 relative to cassette 2 affects the volume of work space needed to tilt and rotate the cassette. For example, if pivot axis 26 traverses the geometric center of the cassette 2, the volume of space required to achieve the desired tilting/rotation is minimized. For some workstations, the volume of work space available for the tilting/rotation action may dictate the design of mechanism 20.

When the motor is energized, e.g., by applying operating voltage, motor shaft 36 will rotate cassette holder 22 and a supported cassette 2 and wafers 4 through an angle ω about the pivot axis 26. In an implementation of this preferred embodiment, Φ≈105°, β≈15°. As a result, a motor shaft rotation ω≈90° produces approximately 90° of tilt, and approximately θ=30° simultaneous rotation about the Z-axis Because Φ>90°, tilting and rotation will cause holder 22 to move away from the motor, as shown by FIG. 3B. In the embodiment of FIGS. 3A and 3B, motor 24 preferably produces a shaft rotation of about 5 revolutions/minute.

Of course support member angles Φ and/or β may be varied to produce different results. For example, the tilt angle need not be precisely 90° and may range from about 45° to about 90°. The precise tilt angle will depend upon the workstation configuration, including the plane of surface 10, which may not be precisely horizontal. The necessary rotation angle θ may range from about 0° to about 90°, and typically depends upon robotic arm 12 and the number of cassettes present at the workstation.

After rotation through angle ω about pivot axis 26, wafers 4 will be in a substantially horizontal orientation and will have a desired alignment angle θ, as shown in FIG. 3B. This orientation and alignment is chosen to permit mechanical removal of the wafers from the cassette by the robotic arm, to facilitate processing of the wafers at the workstation.

After processing at workstation WS is complete, robotic arm 12 will mechanically return the wafers, one at a time, to cassette 2, which is still in the horizontal orientation of FIG. 3B. Motor 24 is then energized to produce rotation in the opposite direction, e.g., through −ω, about the pivot axis 26. Preferably motor 24 is a direct current motor, and counter-rotation may be produced by reversing the polarity of the power source coupled to the motor.

The result of this counter-rotation is that holder 22, cassette 2 and wafers 4 are rotated through an angle −θ about the Z-axis, and are tilted approximately −90°. Thus, holder 22, cassette 2 and wafers 4 are together returned to the substantially vertical orientation of FIG. 3A. A human operator (or mechanical device) may then remove the wafer-loaded cassette 2 from holder 22 for conveyance to another workstation. At such other workstation, the vertically oriented cassette may be placed in a similar mechanism 20, according to the present invention, for tilting and rotation, as required by that workstation.

In the embodiment of FIGS. 3A and 3B, motor 24 is attached to motor mount members 38 and 40 that are inclined at the angle θ relative to each other. In the preferred embodiment, mount members 38 and 40 are integrally formed from a sheet of metal that is bent along a fold-line 42 to define the angle Φ. As such, motor shaft 36 extends orthogonally from mount member 40 and extends orthogonally into the distal portion of support member 38. Mount member 38 may be secured to the workstation surface 10 using screws 44 or the like.

As noted, in the embodiment of FIGS. 3A and 3B, Φ>90° and tilting/rotation moves the holder and cassette away from the motor. This embodiment is convenient for use with workstations that provide sufficient space to the right of the cassette holder for a drive motor, but not to the left. However, space restrictions at other workstations may require that the motor be mounted to the left of the cassette holder, and that the cassette rotate toward the motor. As described below, FIGS. 4A and 4B depict such an alternate embodiment.

Figure 4A:
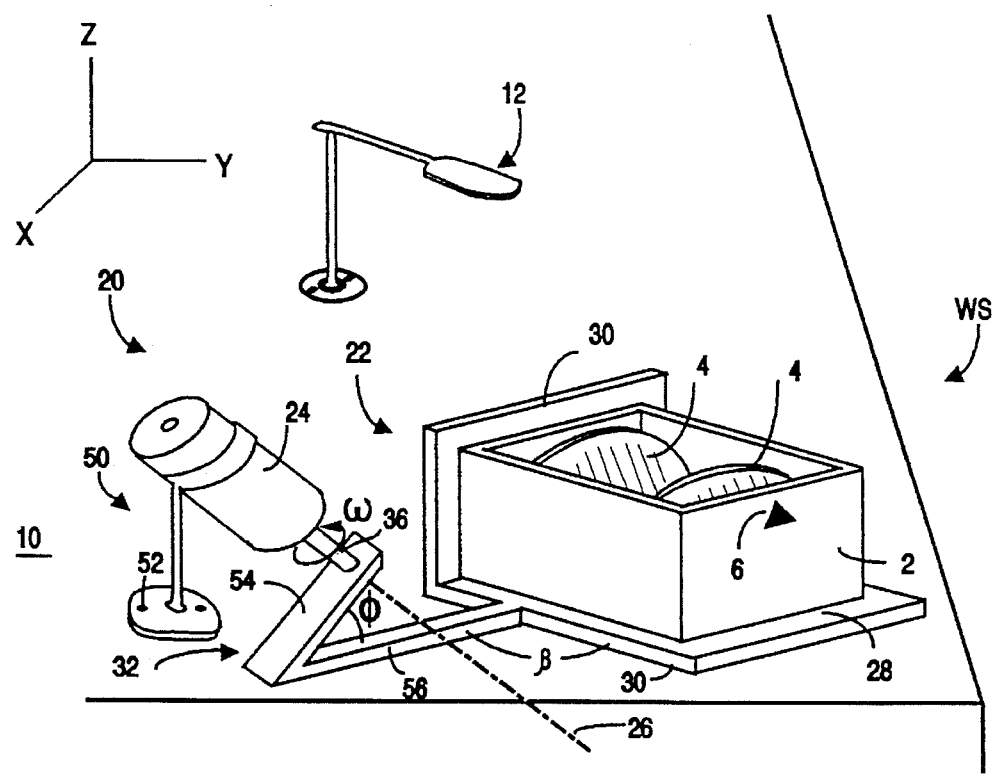
FIG. 4A depicts a second embodiment of a mechanism for tilting and rotating a cassette toward a drive motor (in contrast to what was shown in FIG. 3A), according to the present invention.
Figure 4B:
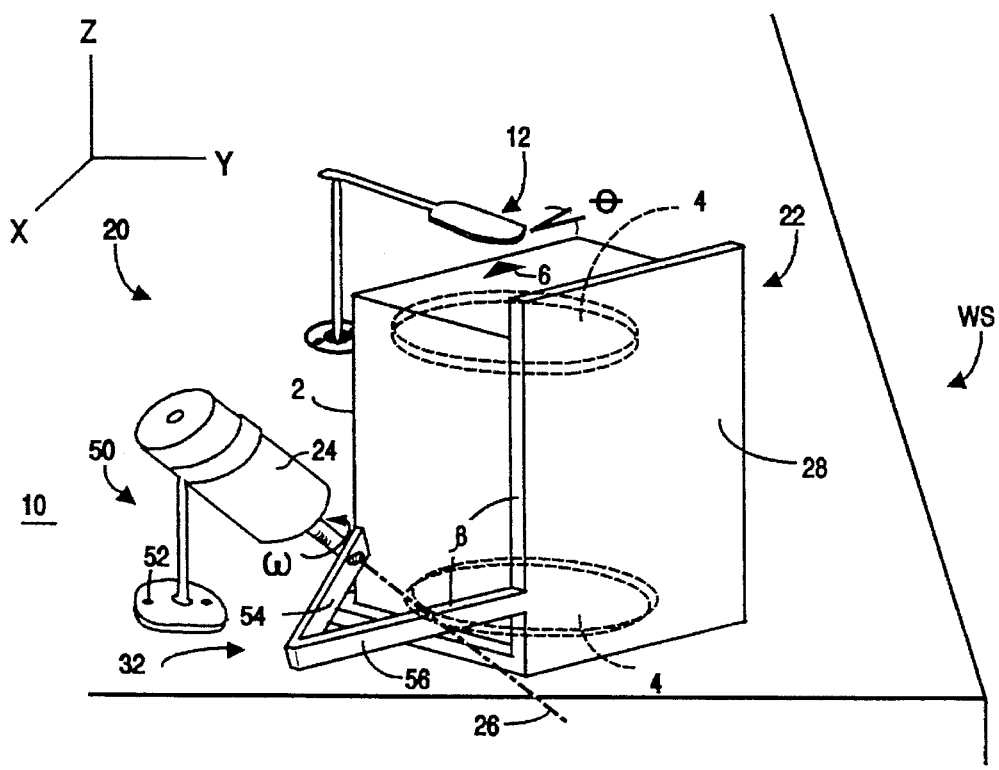
FIG. 4B depicts the embodiment of FIG. 4A after tilting and rotation, according to the present invention.

The embodiment of FIGS. 4A and 4B is similar in several aspects to the above-described first embodiment. In each embodiment, a mechanism 20 includes a cassette holder 22, and a motor 24 that rotates holder 22 about a single pivot axis 26. In FIGS. 4A and 4B, it is the function of mechanism 20 to simultaneously tilt and rotate a wafer-loaded cassette 2 to permit a robotic arm 12 to access wafers 4 within the cassette. Unlike the first embodiment, in FIGS. 4A and 4B, the simultaneous tilting/rotation action moves the cassette holder toward the motor. As such, the embodiment of FIGS. 4A and 4B may be required if the workstation configuration dictates mounting the motor such that there is insufficient space to the left of the motor through which the holder may be tilted and rotated.

More specifically, in the embodiment of FIGS. 4A and 4B, the motor is disposed to the left of the cassette holder 22, and is mounted to the generally horizontal surface 10 of the workstation WS using a bracket 50 and screws, or the like, 52. Rotation of the motor shaft 36 causes holder 22 to simultaneously tilt and rotate, toward the motor, as shown in FIG. 4B.

To facilitate such tilting and rotation, a support member 32 is rigidly attached to support 28. Support member 32 comprises first and second elements 56, 54, respectively between which is defined an angle Φ. Further, second element 56 defines an angle β in the X-Y plane relative to a longitudinal axis of the first plane. Analogously to what was described with respect to the first embodiment, the magnitude of angles Φ and β determine the amount of tilt angle and rotation θ that will result from a given amount of motor shaft rotation ω. Further, if Φ<90°, tilting and rotation about pivot axis 26 will move cassette 2 toward the motor (as shown in FIG. 4B).

Support member 32 elements 54 and 56 may be integrally formed with each other and with cassette holder 22, using metal, or plastic, among other materials. The shaft 36 of motor 24 is attached orthogonally to the distal portion of element 54.

Rotation of the motor shaft 36 through an angle ω will rotate cassette holder 22, cassette 2 and wafers 4 therein about the single pivot axis 26.

In the preferred embodiment, Φ≈75°, β≈15°. Rotation of motor shaft 36 through an angle ω≈90° simultaneously tilts cassette holder 22 substantially 90° (from the vertical orientation of FIG. 4A to the horizontal orientation of FIG. 4B) and produces a θ rotation about the Z-axis of about 30°.

Motor shaft 36 preferably rotates at about 5 revolution/minute and the simultaneous tilting and rotation may be accomplished in a period of time ranging from several seconds to perhaps ten seconds. Depending upon the workstation configuration, the tilt angle required may range from about 45° to 90°, and the rotation angle θ may vary from about 0° to about 90°. Of course different amounts of tilting and/or rotation may be achieved by varying Φ and/or β to thus change the relationship of support member elements 54 and 56.

After such tilting and rotation, cassette 2 will be in the substantially horizontal orientation shown in FIG. 4B, and will have been rotated through a required angle θ. So oriented, the wafers 4 within the cassette may now be mechanically removed from cassette 2 by robotic arm 12 for processing at the workstation.

After workstation processing, robotic arm 12 will return the processed wafers to the cassette, which is still in the horizontal orientation shown in FIG. 4B. The motor 24 is then energized to produce a counter-rotation of −ω, which results in a horizontal-to-vertical tilt reorientation and a counter-rotation −θ about the Z-axis. The cassette is thus returned to the vertical orientation of FIG. 4A, and may be removed manually or otherwise from holder 22 and safely conveyed to another workstation.

Although the embodiments of FIGS. 3A and 3B, and 4A and 4B provide design flexibility in locating the motor on the right or left side of the cassette holder, neither embodiment readily permits locating the motor below the horizontal surface 10 of the workstation WS. In the embodiment of FIGS. 3A and 3B, for example, although motor 24 could be mounted beneath surface 10, the shaft 36 would extend from surface 10 at an angle of about 75° (e.g., the complement of Φ). Further, the extended shaft length might have to be 10" (25.4 cm) or more to provide the necessary volume of work space through which the cassette holder is tilted and rotated. The resultant shaft length may project over more workstation space than is available and could also create excessive torque requirements for motor 24.

As noted, while the embodiments of FIGS. 3A–3B, and 4A–4B provide flexibility in controlling whether tilting and rotation motion is away from or toward the motor, it is difficult to implement these embodiments and locate the motor beneath the workstation surface. This problem of locating the motor beneath the workstation surface is addressed by the third embodiment of the present invention depicted in FIG. 5.

Figure 5:
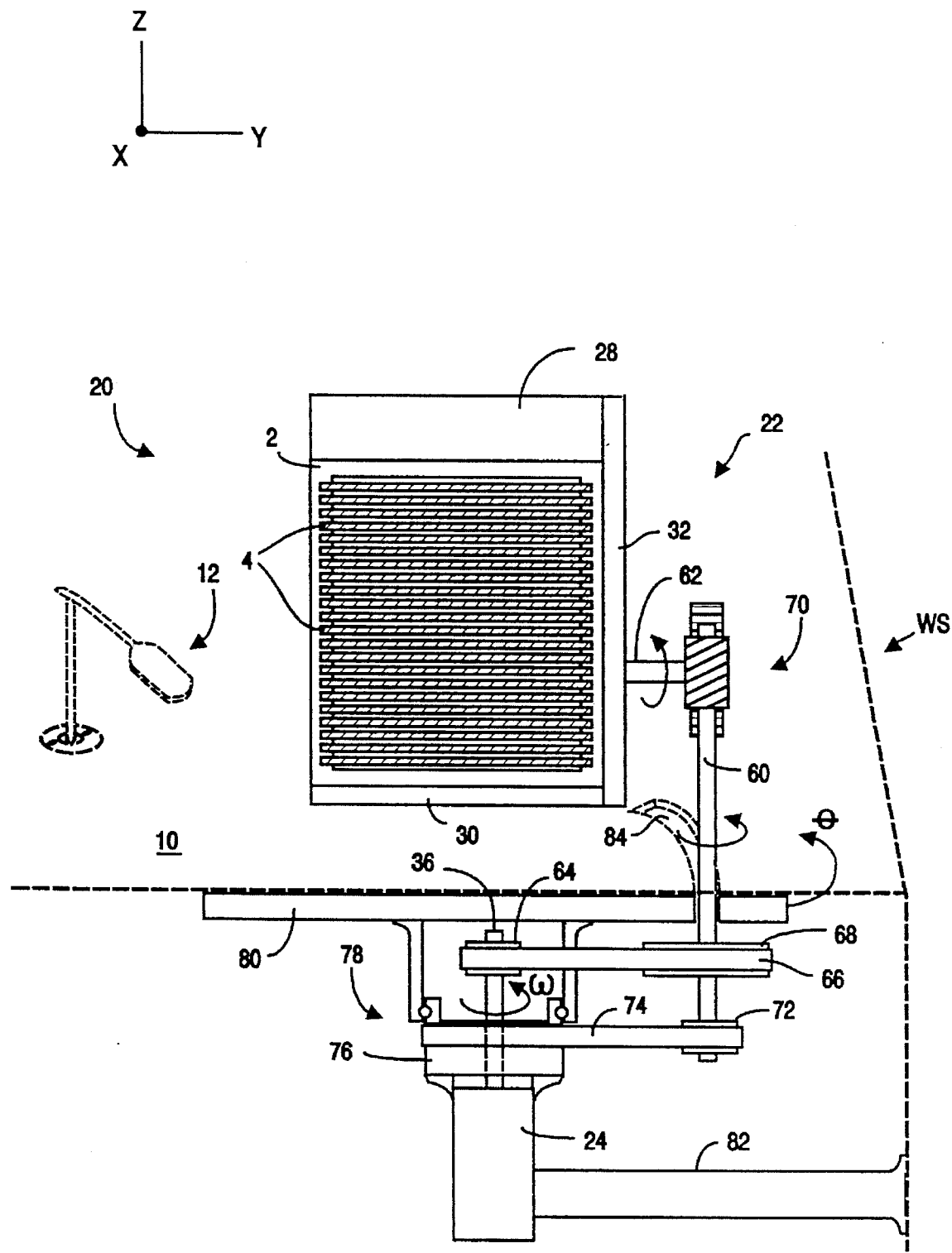
FIG. 5 depicts a third embodiment of a mechanism for tilting and rotating a cassette, according to the present invention.

In FIG. 5, mechanism 20 simultaneously tilts and rotates a cassette 2 loaded with wafers 4. However, in contrast to the embodiments of FIGS. 3A–4B, in this third embodiment motor 24 is located beneath surface 10 of a workstation WS. The workstation WS and its robotic arm 12 are shown in phantom in FIG. 5 as they are drawn in perspective, whereas mechanism 20 is depicted in a frontal cross-sectional view.

In FIG. 5, cassette 2 is shown in a horizontal orientation, with the plane of the wafers 4 normal to the printed page. Mechanism 20 includes a cassette holder 22, a motor 24, and assorted pulleys, belts, shafts and worm gear mechanism, described below. As in the embodiments of FIGS. 3A–4B, holder 22 includes supports 28 and 30 that define orthogonal first and second planes. A support member 32 may be integrally formed with holder 22.

Mechanism 20 further includes a vertical shaft 60 and a horizontal shaft 62. Rotation of motor shaft 36 is coupled by pulley 64 and pulley belt 66 to pulley 68, causing rotation of vertical shaft 60. The rotation of vertical shaft 60 is coupled to a reduction worm gear assembly 70 that rotates horizontal shaft 62 through the necessary tilt angle, typically 45° to about 90°.

As shown in FIG. 5, a pulley 72 is also coupled to the vertical shaft 60, whose rotation is carried by pulley belt 74 to a pulley 76. The lower end of pulley 76 is rigidly attached to the housing of motor 24. The upper end of pulley 76 is rotatably and coaxially attached to a bearing unit and support cylinder 78. The upper end of the bearing unit and support cylinder 78 is fixedly attached to a preferably circular support plate 80 that is free to rotate in the X-Y plane about the vertical axis of motor shaft 36.

Rotation of motor shaft 36 causes rotation of vertical shaft 60. The rotation of vertical shaft 60 is then coupled by pulley 72, belt 74 and pulley 76 to the bearing unit and support cylinder 78. As shown in FIG. 5, motor 24 is fixedly attached to the workstation by motor mount member 82. As a result, the support plate 80, and thus pulleys 64, 68, 72, 76, pulley belts 66, 74, bearing unit and support cylinder 78 and support plate 80 all rotate through an angle θ in the X-Y plane, about the vertical axis of motor shaft 36.

The rotating support plate 80 may protrude through a circular opening in the surface 10 of the workstation and be flush with surface 10. Alternatively, as shown in FIG. 5, support plate 80 may be disposed below surface 10, and an arcuate-shaped opening 84 may be formed in surface 10. Vertical shaft 10 protrudes through opening 84, to be moved in an arc through the rotation angle θ about the axis of motor shaft 36.

As noted above, rotation of vertical shaft 60 also produces tilting of cassette holder 22 through a desired tilt angle, due to the action of worm gear assembly 70 upon the horizontal shaft 62. The resultant simultaneous tilting and rotation action tilts cassette holder 22 through a tilt angle that typically is in the range of about 45° to 90°, and produces a rotation about the Z-axis through an angle θ that ranges from about 0° to about 90°.

In the preferred embodiment, the shaft 36 of motor 24 rotates at about 100 revolutions/minute, and worm gear assembly 70 has a reduction of about 15:1, although other motor speeds and reduction ratios could of course be used. The resultant simultaneous tilting and rotation of cassette holder 22 preferably takes from a few seconds to perhaps ten seconds to complete.

In addition to providing a configuration most of which may be disposed beneath the workstation surface 10, the embodiment of FIG. 5 minimizes the volume of space required as the cassette 2 is tilted and rotated, as contrasted to the embodiments of FIGS. 3A–4B. Although FIG. 5 depicts the motor axis 36 as roughly bisecting the horizontal width of support 30, the length of horizontal shaft 62 may be changed to produce a non-bisecting configuration. Similarly, although horizontal shaft 62 could bisect the vertical length of support 28, such need not be the case (as indeed FIG. 5 indicates).

Figure 1A:
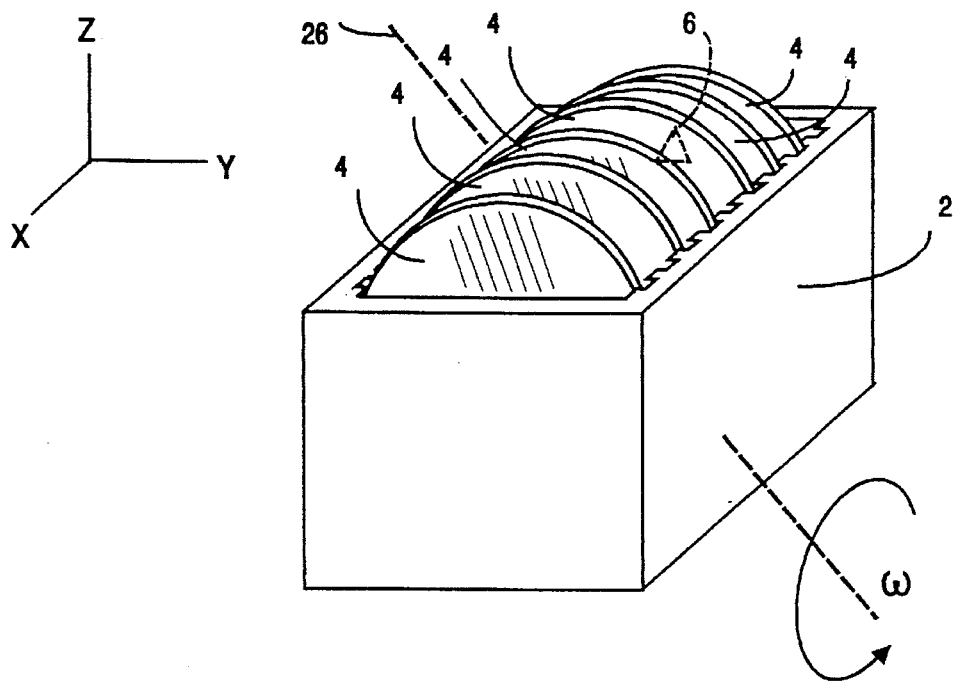
FIG. 1A depicts a cassette with wafers, in a vertical orientation.
Figure 1B:
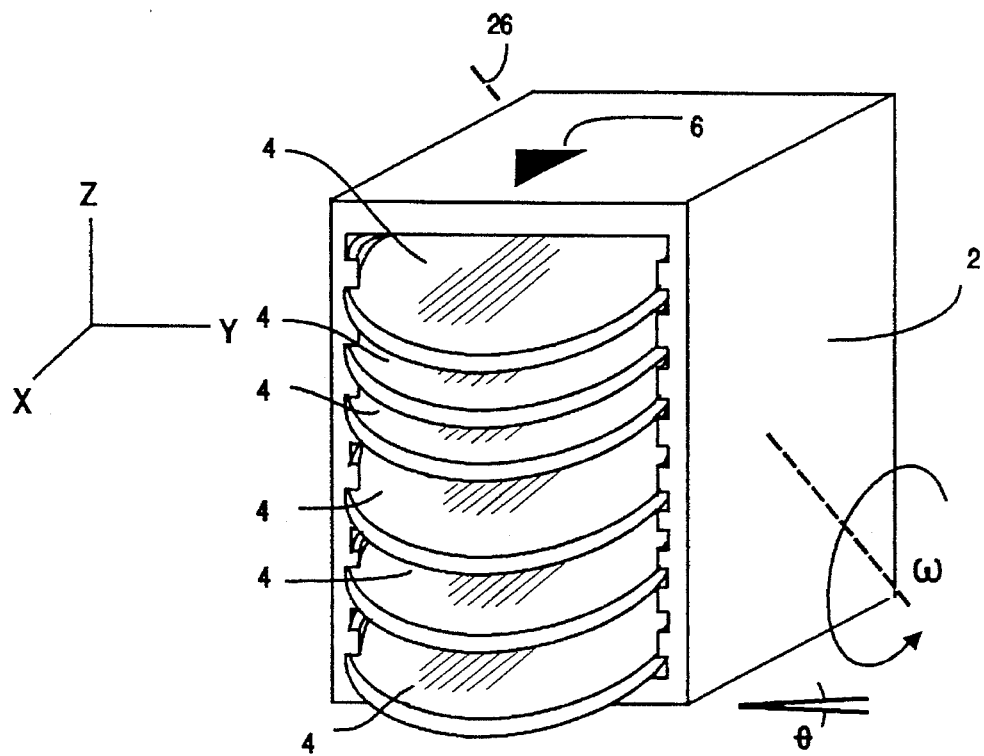
FIG. 1B depicts the cassette of FIG. 1A in a horizontal orientation.
Figure 2:
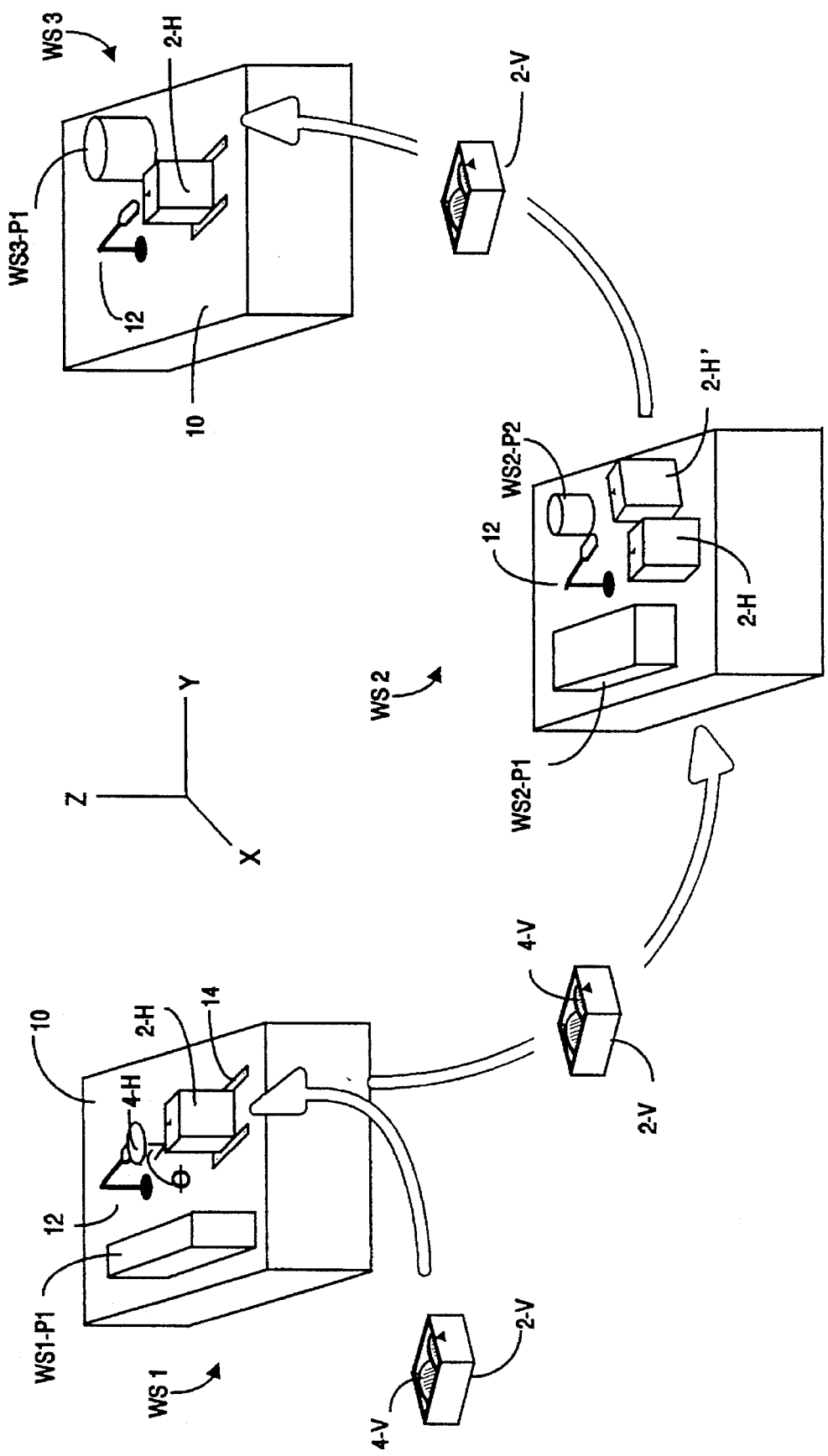
FIG. 2 depicts a generic fabrication facility, and shows the horizontal orientation of a cassette at various workstations, and the vertical orientation of the cassette while being conveyed between workstations.

After mechanism 20 has tilted and rotated cassette holder 22 into a horizontal orientation, a robotic arm 12 associated with workstation WS removes the wafers 4 from cassette 2 for processing. After workstation processing, robotic arm 12 returns the wafers to cassette 2, and motor 24 is energized to rotate shaft 36 in the opposite direction. This counter-rotation produces a counter-tilt and counter-rotation that returns cassette 2 to a vertical orientation, such as was shown in FIG. 1A.

To recapitulate, any of the embodiments of FIGS. 3A–5 may be used in existing fabs in which wafer-loaded cassettes 2 will have been carried in a vertical orientation to the workstation and placed on cassette holder 22 by a human operator. However, the various embodiments of the present invention may also be used in future fabs, in which an automatic conveyor belt will convey vertically oriented wafer-loaded cassettes from workstation to workstation. In such fabs, once the wafer-loaded cassettes have been conveyed to a workstation, they can be automatically and mechanically removed from the conveyor and may be mechanically placed upon a holder 22, according to the present invention.

Figure 6:
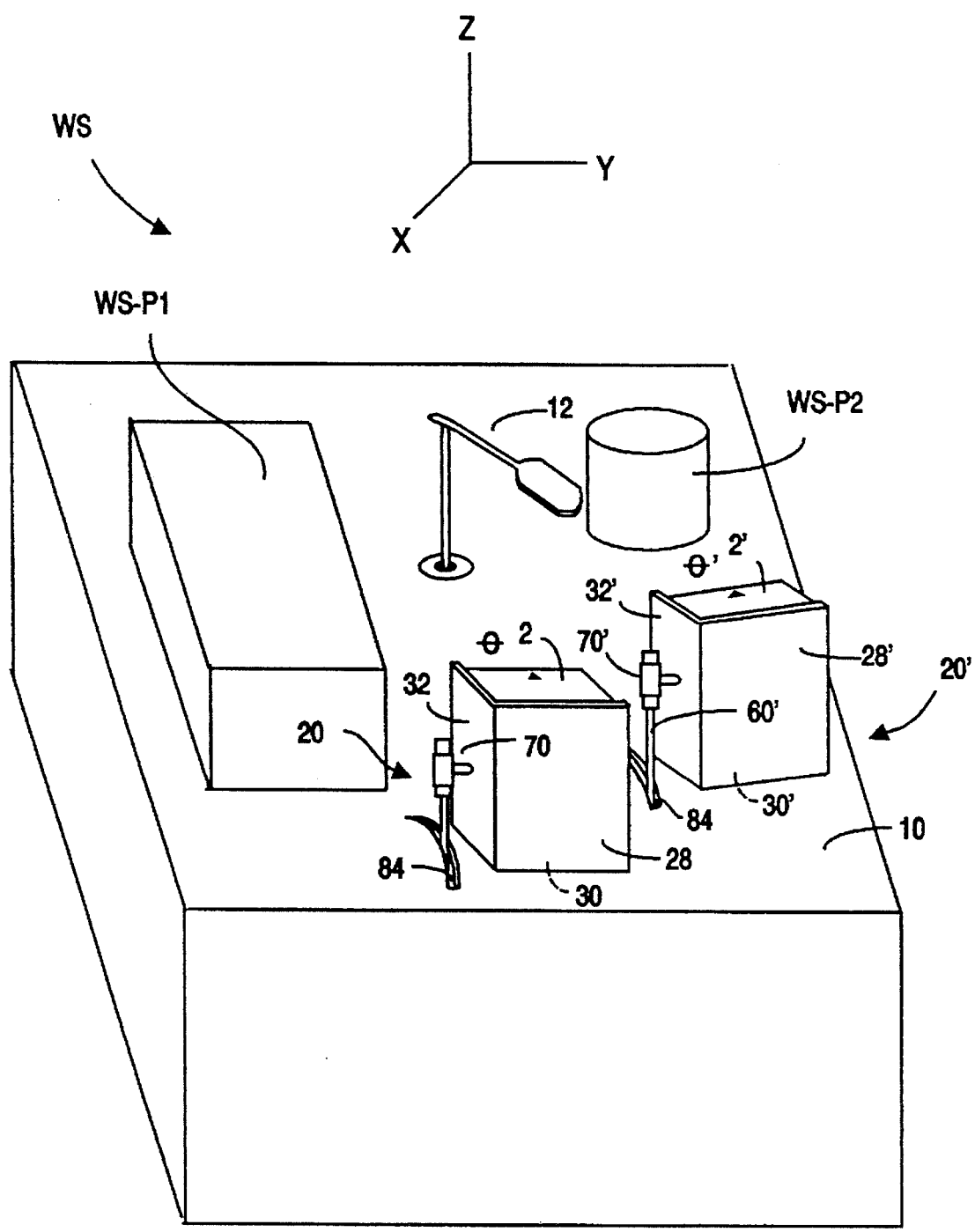
FIG. 6 depicts a workstation constructed to include two mechanisms that each simultaneously tilt and rotate a cassette, according to the present invention.

Although the various embodiments of the present invention may be retrofitted to existing workstations, it is also intended that workstations WS be constructed to include the present invention. FIG. 6, for example, depicts a workstation WS constructed to include mechanism 20 and mechanism 20' for tilting and rotation wafer-loaded cassettes 2 and 2', respectively. Shown generically are WS-P1 and WS-P2, representing procedures that may be carried out at the workstation upon a wafer 4 that has been removed from cassette 2 or 2' by robotic arm 12.

Generally each mechanism 20, 20' will tilt a cassette through the same tilt angle, although individual tilt angles may also be provided. Typically each mechanism will require a different angle of rotation, depending upon the configuration of the workstation. Thus, as shown in FIG. 6, mechanism 20 may rotate cassette 2 through angle θ, whereas mechanism 20' may rotate cassette 2' through a different angle θ'.

Rotational power to the various mechanisms 20, 20' may be energized sequentially or simultaneously and in some configurations, rotation from a single motor may be coupled to rotate more than one mechanism. Although FIG. 6 depicts two mechanisms 20 and 20' that are identical, e.g., each is the embodiment of FIG. 5, if desired each mechanism could be implemented with a different embodiment of the present invention. Finally, although FIG. 6 shows a workstation constructed to include two mechanisms according to the present invention, a different number of mechanisms may be provided. Modifications and variations may be made to the disclosed embodiments without departing from the subject and spirit of the invention as defined by the following claims.

What is claimed is:

1. A mechanism for simultaneously tilting and rotating a wafer cassette, comprising:

a cassette holder including first and second supports defining respective generally orthogonal first and second planes, said cassette holder having a pivot axis oblique to both said first and second planes;

a motor coupled to said cassette holder so as to rotate said cassette holder about said pivot axis such that said cassette holder tilts through a tilt angle and rotates through a rotation angle;

said mechanism causing a wafer-loaded wafer cassette placed in said cassette holder to be supported by at least one of said first and second supports and to be tilted through said tilt angle and to be rotated through said rotation angle; and a support member fixedly coupled between the first support and a rotatable shaft of said motor, said support member being shaped to cause said tilt angle to have a desired magnitude in response to a given amount of rotation of said rotatable shaft.

2. The mechanism of claim 1, wherein said cassette holder further includes:

a support member fixedly coupled between the first support and a rotatable shaft of said motor, said support member being shaped to cause tilting and rotation of said mechanism about said pivot axis in a chosen direction relative to a mounting location of said motor.

3. A mechanism for simultaneously tilting and rotating a wafer cassette, comprising:

a cassette holder including first and second supports defining respective generally orthogonal first and second planes, said cassette holder having a pivot axis oblique to both said first and second planes;

a motor coupled to said cassette holder so as to rotate said cassette holder about said pivot axis such that said cassette holder tilts through a tilt angle and rotates through a rotation angle;

said mechanism causing a wafer-loaded wafer cassette placed in said cassette holder to be supported by at least one of said first and second supports and to be tilted through said tilt angle and to be rotated through said rotation angle; and a support member having a first portion and a second portion that together define an angle Φ therebetween, said first portion being fixedly attached to said first support and being coplanar with id first plane; said second portion having a distal region rigidly coupled to said rotatable shaft for rotation therewith; an intersection of said first portion and said second portion defining an angle β relative to a longitudinal axis of said first plane;

said tilt angle and said rotation angle being determined at least in part by a magnitude of said angle Φ and a magnitude of said angle β.

4. The mechanism of claim 3, wherein when said angle Φ>90° said mechanism rotates said cassette holder about said pivot axis toward said motor, and when said angle Φ<90° said mechanism rotates said cassette holder about said pivot axis away from said motor.

5. The mechanism of claim 3, further including a motor mount member having a first element and a second element that together define said angle Φ therebetween;

said second element being disposed parallel to said second portion of said support member and defining an opening through which said rotatable shaft of said motor extends, said motor being fixedly attached to said second element;

said first element being mountable to a work surface of a workstation at which said mechanism is to simultaneously tilt and rotate said a wafer-loaded cassette.

6. A mechanism for simultaneously tilting and rotating a wafer cassette, comprising:

a cassette holder including first and second supports defining respective generally orthogonal first and second planes, said cassette holder having a pivot axis oblique to both said first and second planes;

a motor coupled to said cassette holder so as to rotate said cassette holder about said pivot axis such that said cassette holder tilts through a tilt angle and rotates through a rotation angle;

said mechanism causing a wafer-loaded wafer cassette placed in said cassette holder to be supported by at least one of said first and second supports and to be tilted through said tilt angle and to be rotated through said rotation angle; and a support member fixedly coupled between the first support and a rotatable shaft of said motor, said support member being shaped to cause said rotation angle to have a desired magnitude in response to a given amount of rotation of said rotatable shaft.

7. A mechanism for simultaneously tilting and rotating a wafer cassette, comprising:

a cassette holder including first and second generally orthogonal supports;

a motor coupled to said cassette holder so as to rotate said cassette holder such that said cassette holder tilts through a tilt angle and simultaneously rotates through a rotation angle; and means for translating rotation of a rotary shaft of said motor into a vertically-rotating component and into a horizontally-rotating component;

said vertically-rotating component producing said rotation angle having a desired magnitude, and said horizontally-rotating component producing said tilt angle having a desired magnitude; and said mechanism causing a wafer-loaded wafer cassette placed in said cassette holder to be supported by at least one of said first and second supports and to be tilted through said tilt angle and to be rotated through said rotation angle.

8. A mechanism for simultaneously tilting and rotating a wafer cassette, comprising:

a cassette holder including first and second generally orthogonal supports;

a motor coupled to said cassette holder so as to rotate said cassette holder such that said cassette holder tilts through a tilt angle and simultaneously rotates through a rotation angle;

a vertical shaft, spaced-apart from and parallel to said rotatable shaft of said motor;

a first pulley and belt assembly, coupled between said rotatable shaft and said vertical shaft so as to rotate said vertical shaft in response to rotation of said rotatable shaft;

a horizontal shaft having a first end and a second end, said first end being coupled to said cassette holder;

a worm gear unit having an input coupled to said vertical shaft and having an output coupled to said second end of said horizontal shaft, said worm gear rotating said horizontal shaft in response to rotation of said rotatable shaft to produce said tilt angle having a desired magnitude; and a second pulley and belt assembly, including a pulley fixedly coupled to a housing enclosing said motor, coupled between said rotatable shaft and said vertical shaft such that rotation of said second pulley and belt assembly rotates said cassette holder through said rotation angle about said rotatable shaft; and said mechanism causing a wafer-loaded wafer cassette placed in said cassette holder to be supported by at least one of said first and second supports and to be tilted through said tilt angle and to be rotated through said rotation angle.

9. A semiconductor fabrication workstation including a robotic arm that removes a horizontally oriented semiconductor wafer from a wafer cassette, the workstation including:

a workstation surface;

at least one mechanism, mounted to said workstation, for simultaneously tilting and rotating said wafer cassette containing at least one semiconductor wafer, said mechanism including:

a cassette holder including first and second supports; and a motor coupled to said cassette holder so as to rotate said cassette holder such that said cassette holder tilts through a tilt angle and rotates through a rotation angle;

said mechanism causing a wafer-loaded wafer cassette placed in said cassette holder to be supported by at least one of said first and second supports and to be tilted said tilt angle and to be rotated said rotation angle to permit access by said robotic arm to at least one said semiconductor wafer.

10. The workstation of claim 9, wherein:

said first and second supports define respective orthogonal first and second planes, said cassette holder having a pivot axis oblique to both said first and second planes; and said motor rotates said cassette holder about said pivot axis.

11. The workstation of claim 9, wherein rotation of said cassette holder produces at least one result selected from the group consisting of (i) said tilt angle having a magnitude ranging from about 45° to about 90°, and (ii) said rotation angle having a magnitude ranging from about 0° to about 90°.

12. The workstation of claim 9, wherein said cassette holder further includes:

a support member fixedly coupled between the first support and a rotatable shaft of said motor, said support member being shaped to produce at least one result selected from the group consisting of (i) causing said tilt angle to have a desired magnitude in response to a given amount of rotation of said rotatable shaft, (ii) causing said rotation angle to have a desired magnitude in response to said given amount of rotation of said rotatable shaft, and (iii) causing rotation of said mechanism in a chosen direction relative to a mounting location of said motor.

* * * * *